(12) United States Patent
Lin et al.

(10) Patent No.: US 12,379,674 B2
(45) Date of Patent: *Aug. 5, 2025

(54) METHOD AND APPARATUS FOR IMPROVING CRITICAL DIMENSION VARIATION

(71) Applicant: TAIWAN SEMICONDUCTOR MANUFACTURING COMPANY, LTD., Hsinchu (TW)

(72) Inventors: Ming-Hsun Lin, Hsinchu (TW); Yu-Hsiang Ho, Taichung (TW); Chi-Hung Liao, New Taipei (TW); Teng Kuei Chuang, Taichung (TW); Jhun Hua Chen, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/646,813

(22) Filed: Apr. 26, 2024

(65) Prior Publication Data

US 2024/0295831 A1 Sep. 5, 2024

Related U.S. Application Data

(63) Continuation of application No. 18/109,183, filed on Feb. 13, 2023, now Pat. No. 11,988,972, which is a (Continued)

(51) Int. Cl.
*G03F 7/00* (2006.01)

(52) U.S. Cl.
CPC ........ *G03F 7/7085* (2013.01); *G03F 7/70558* (2013.01); *G03F 7/70925* (2013.01)

(58) Field of Classification Search
CPC ............... G03F 7/7085; G03F 7/70558; G03F 7/70925; G03F 1/82; G03F 7/70625; G03F 7/70033; G03F 7/70916; G03F 7/705; G03F 7/70605–706851; G03F 7/70533; G03F 7/708; G03F 7/70808; G03F 7/70841; G03F 7/70858; G03F 7/70866; G03F 7/70908–70941; G03F 7/70975;
(Continued)

(56) References Cited

U.S. PATENT DOCUMENTS 6,414,743 B1   7/2002  Nishi et al.
8,149,378 B2   4/2012  Morishima et al.
(Continued)

FOREIGN PATENT DOCUMENTS

CN   1525160   9/2004
CN   1534381   10/2004
(Continued)

*Primary Examiner* — Christina A Riddle
(74) *Attorney, Agent, or Firm* — NZ Carr Law Office

(57) ABSTRACT

A method is described. The method includes obtaining a relationship between a thickness of a contamination layer formed on a mask and an amount of compensation energy to remove the contamination layer, obtaining a first thickness of a first contamination layer formed on the mask from a thickness measuring device, and applying first compensation energy calculated from the relationship to a light directed to the mask.

20 Claims, 9 Drawing Sheets

Related U.S. Application Data continuation of application No. 17/380,633, filed on Jul. 20, 2021, now Pat. No. 11,579,539.

(60) Provisional application No. 63/156,016, filed on Mar. 3, 2021.

(58) Field of Classification Search
CPC ............ G03F 7/70983; G03F 7/70991; G03F 7/70483–70541; G03F 7/7055; G03F 7/707; G03F 7/70716; G03F 1/22; G03F 1/24; G03F 1/68; G03F 1/72; G03F 1/80; G03F 1/84; G03F 7/70741; G03F 7/70933; G03F 7/7065; G03F 7/70525; G03F 7/70616; G03F 7/70783; G03F 7/70958; G03F 1/44; G03F 7/70733; G03F 7/70691; G03F 7/70491; H05G 2/00–0094; G01N 21/94; G01N 2021/95676; G01N 21/9501; G01N 27/24; H01L 21/67253; H01L 22/00
USPC ........ 355/30, 52–55, 67–77; 430/5, 30, 311, 430/322; 356/237.1–237.6, 630; 250/492.1, 492.2, 492.22, 504 R See application file for complete search history.

(56) References Cited

U.S. PATENT DOCUMENTS

| | | |
|---|---|---|
| 8,268,541 B2 | 9/2012 | Lin et al. |
| 10,642,165 B2 | 5/2020 | Huang et al. |
| 11,579,539 B2 | 2/2023 | Lin et al. |
| 11,988,972 B2 * | 5/2024 | Lin .................... G03F 1/82 |
| 2001/0043321 A1 | 11/2001 | Nishi et al. |
| 2003/0127607 A1 | 7/2003 | Van Der Veen |
| 2005/0121144 A1 | 6/2005 | Edo et al. |
| 2006/0163500 A1 | 7/2006 | Inoue et al. |
| 2007/0146658 A1 | 6/2007 | Van Mierlo et al. |
| 2009/0063074 A1 | 3/2009 | Wang et al. |
| 2011/0279799 A1 | 11/2011 | Singer et al. |
| 2012/0086800 A1 | 4/2012 | Vladimirsky et al. |
| 2013/0194559 A1 | 8/2013 | Patra |
| 2017/0285493 A1 | 10/2017 | Andre et al. |
| 2020/0089132 A1 | 3/2020 | Hsieh et al. |

FOREIGN PATENT DOCUMENTS

| | | |
|---|---|---|
| CN | 107388976 | 11/2017 |
| CN | 112305856 | 2/2021 |
| TW | 200426363 | 12/2004 |
| TW | 201221943 | 6/2012 |

* cited by examiner

METHOD AND APPARATUS FOR IMPROVING CRITICAL DIMENSION VARIATION

CROSS-REFERENCE TO RELATED APPLICATIONS

This application is a continuation application of U.S. patent application Ser. No. 18/109,183, filed Feb. 13, 2023, which is a continuation application of U.S. patent application Ser. No. 17/380,633, filed Jul. 20, 2021, which claims its priority to U.S. provisional patent application No. 63/156,016, filed Mar. 3, 2021, all of the above mentioned applications are incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a substrate.

Although existing methods and devices for lithography process have been adequate for their intended purposes, they have not been entirely satisfactory in all respects. Consequently, it would be desirable to provide a solution for reducing contamination on EUV masks in order to improve critical dimension variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
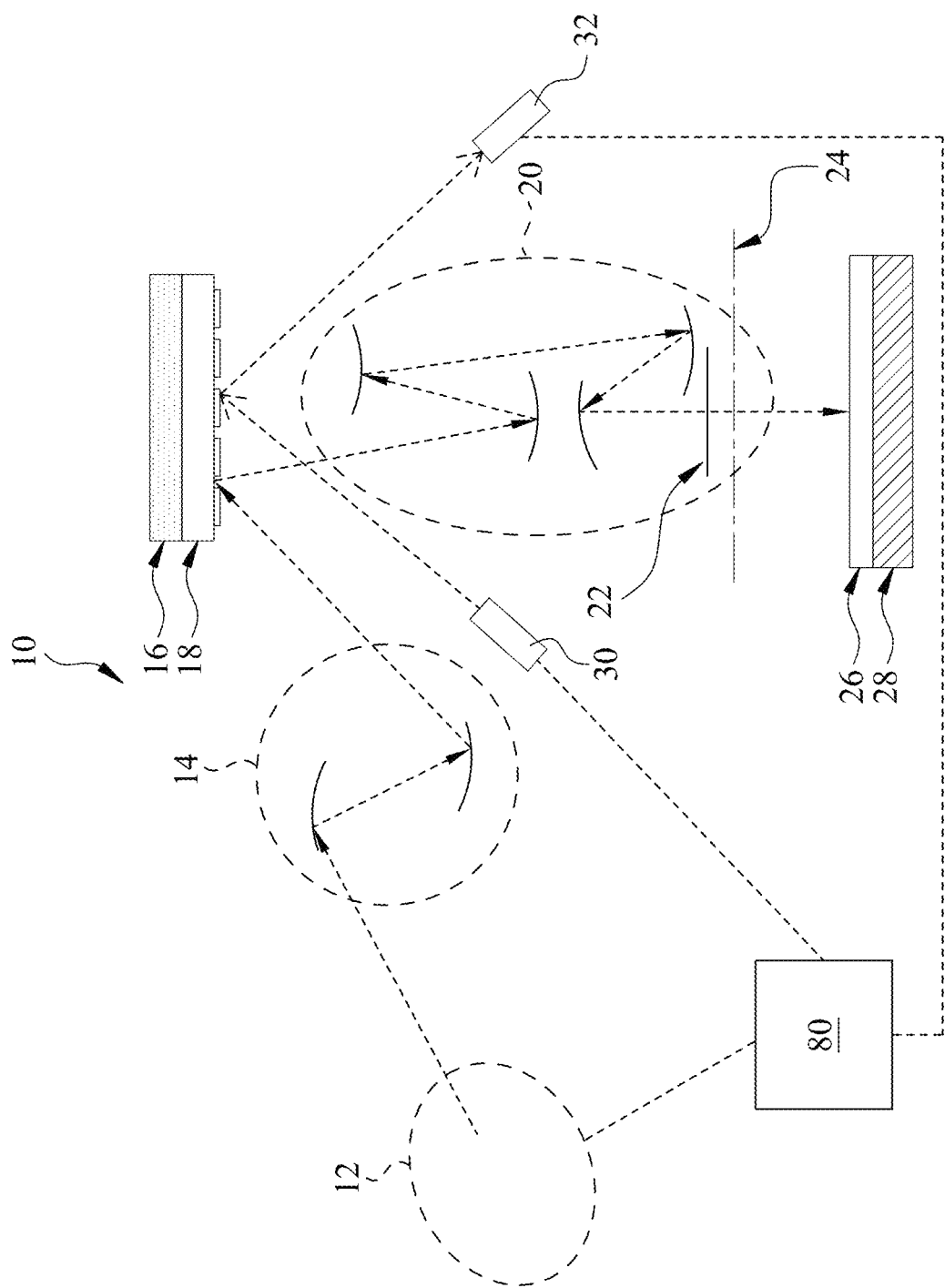
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view diagram of a lithography system 10, in accordance with some embodiments. The lithography system 10 may be generically referred to as a scanner that is configured to perform lithography exposure processes with respective radiation source and exposure mode. In some embodiments, the lithography system 10 is an EUVL system. For example, the lithography system may be designed to expose a photoresist layer by EUV light or EUV radiation. The photoresist layer is a material sensitive to the EUV light. The lithography system 10 employs a radiation source 12 to generate light, such as EUV light having a wavelength ranging between about 1 nm and about 100 nm. In one example, the radiation source 12 generates an EUV light with a wavelength centered at about 13.5 nm. Accordingly, the radiation source 12 may be an EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors, in order to direct light from the radiation source 12 onto a mask stage 16, particularly to a mask 18 provided on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiments, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence of at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence of at most 0.3 in some embodiments.

The mask stage 16 is configured to secure the mask 18. In some embodiments, the mask stage 16 includes an electrostatic chuck (e-chuck) to secure the mask 18. This is because gas molecules absorb EUV light, and the lithography system for the EUVL patterning is maintained in a vacuum environment to avoid the EUV intensity loss. In the disclosure, the terms of mask, photomask, and reticle are used interchangeably to refer to the same item. The mask 18 is described in detail in FIG. 2.

The lithography system 10 may include a projection optics module (or projection optics box (POB) 20 for imaging the pattern 52 of the mask 18 on to a substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern 52 defined on the mask 18, is collected by the POB 20. The POB 20 may include a magnification of less than one (thereby the size of the "image" on a target (such as the substrate 26 discussed below) is smaller than the size of the corresponding "object" on the mask 18). The illuminator 14 and the POB 20 are collectively referred to as an optical module of the lithography system 10.

The lithography system 10 may include a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure the substrate 26 to be patterned. The substrate may be a semiconductor substrate. In some embodiments, the substrate 26 is a silicon substrate or other type of semiconductor substrate. The substrate 26 is coated with a resist layer sensitive to the radiation, such as EUV light in some embodiments.

Figure 2:
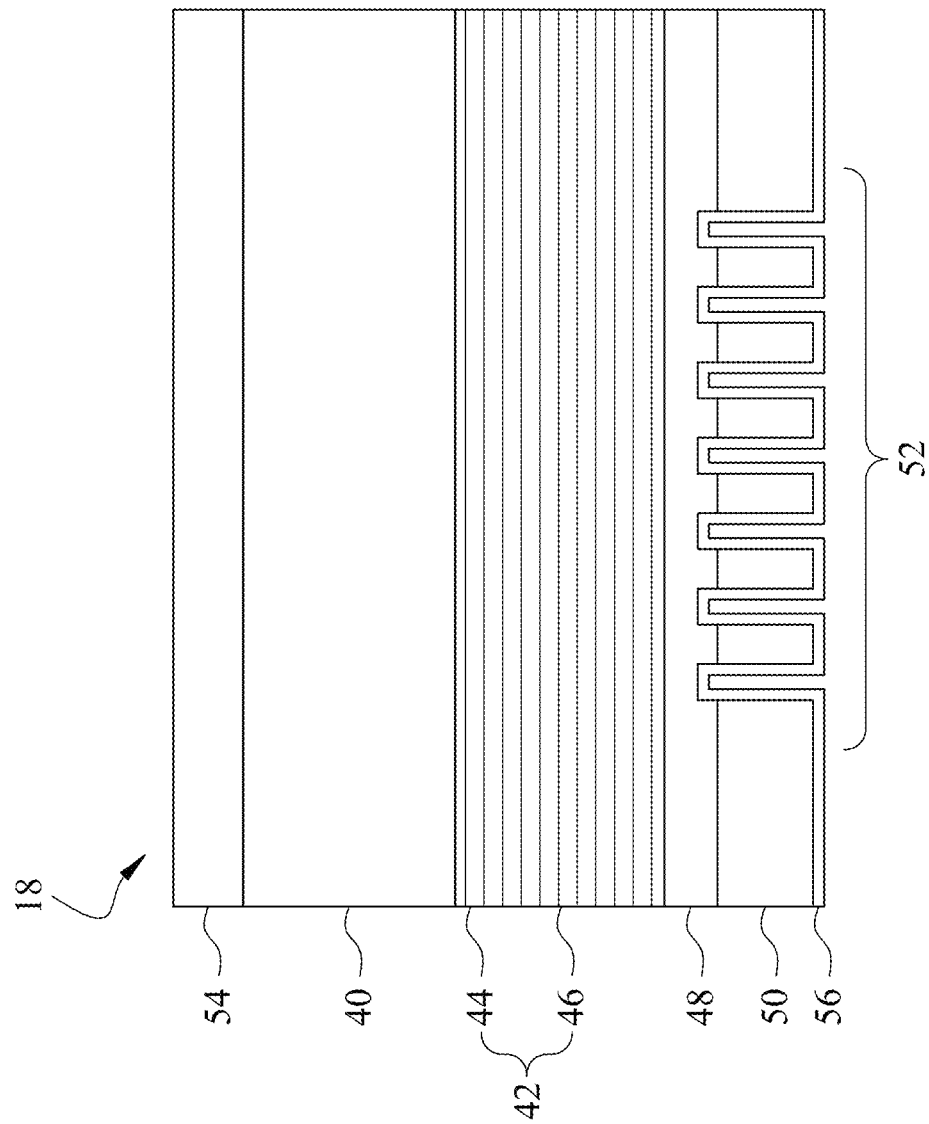
FIG. 2 is a cross-sectional view of a mask, in accordance with some embodiments.

FIG. 2 is a cross-sectional view of the mask 18, in accordance with some embodiments. In some embodiments, the lithography system 10 is an EUVL system, and the mask 18 is a reflective mask. As shown in FIG. 2, the mask 18 includes a substrate 40. The substrate 40 may include any suitable material, such as a low thermal expansion material or fused quartz. For example, the material of the substrate 40 includes $TiO_2$, doped $SiO_2$, or other suitable materials with low thermal expansion coefficient. The mask 18 may further include a reflective multilayer (ML) 42 disposed on the substrate 40. The ML 42 includes alternating layers 44, 46. In some embodiments, the layer 44 includes Mo and the layer 46 includes Si or Be. The layers 44, 46 may include any suitable material that is highly reflective with respect to EUV light. The mask 18 may further include a capping layer 48, such as ruthenium (Ru), disposed on the ML 42 for protection. The mask 18 further includes an absorption layer 50, such as a tantalum boron nitride (TaBN) layer, disposed over the ML 42. The absorption layer 50 includes a pattern 52 to define a layer of an integrated circuit (IC). In some embodiments, the mask 18 includes a conductive backside coating 54. Alternatively, another reflective layer may be deposited over the ML 42 and is patterned to define a layer of an integrated circuit, thereby forming an EUV phase shift mask.

After a period of time that the mask 18 is not being used in the process, a contamination layer 56 may be formed on the absorption layer 50, as shown in FIG. 2. The contamination layer 56 may include carbon and/or oxide. For example, the mask 18 may be idle in the lithography system or in a mask storage, and the absorption layer 50 may be partially oxidized, and the oxidized portion may be the contamination layer 56. The contamination layer 56 may cause a decrease in critical dimension (CD) in EUV exposure when the mask 18 having the contamination layer 56 is used in process. The contamination layer 56 may be removed by increasing the energy of the light from the light source 12. However, in some other embodiments, a dummy substrate is used when removing the contamination layer 56, because higher energy light may negatively affect the pattern formed on the substrate 26 if the thickness of the contamination layer 56 is less than expected. In order to increase throughput by eliminating the use of dummy substrate, a thickness measuring device is provided in the lithography system 10.

Referring back to FIG. 1, the lithography system 10 further includes a light source 30 and a detector 32, as shown in FIG. 1. The light source 30 and the detector 32 may be part of a thickness measuring device for measuring a thickness of the contamination layer 56 (FIG. 2) formed on the mask 18. The device may be any suitable thickness measuring device. For example, the device may utilize ellipsometry to measure the thickness of the contamination layer 56 on the mask 18. Ellipsometry is an optical technique for investigating properties of thin films, and can be used to characterize thickness or depth. The change in polarization is used as a signal after an incident light interacting with the contamination layer 56. This is because that the polarization change depends on the thickness of the contamination layer 56. In some embodiments, the light source 30 may be a visible light source or invisible light source. For example, the light source 30 is a laser. The light source 30 may produce a light having one or more wavelengths, and the light is directed to and reflected from the mask 18. The reflected light is detected by the detector 32, and the thickness of the contamination layer 56 may be measured. Other components (not shown) of the thickness measuring device may include a polarizer and an analyzer.

The thickness measuring device described above utilizes ellipsometry to measure the thickness of the contamination layer 56. In some embodiments, other types of thickness measuring techniques may be utilized by the thickness measuring device, such as interferometry, reflectometry, picosecond ultrasonics, atomic force microscopy (AFM), scanning tunneling microscopy (STM), scanning electron microscopy (SEM), transmission electron microscopy (TEM), or other suitable techniques.

The thickness measuring device (i.e., the light source 30 and the detector 32) is electrically connected to a controller 80, as shown in FIG. 1. The controller 80 controls the process of the thickness measuring device. The controller 80 may be also electrically connected to the light source 12 to control the energy of the light emitted by the light source 12. The controller 80 may include a processor, a memory, a transmitter, and a receiver. In some embodiments, the controller 80 is configured to collect and analyze measured thickness data from the thickness measuring device (i.e., the light source 30 and the detector 32), and to determine whether compensation energy should be applied to the light emitted by the light source 12. The controller 80 may also determine the amount of compensation energy to be applied to the light emitted by the light source 12. For example, if the energy of the light emitted by the light source 12 is set to be X mJ, and the controller determines that a Y amount of compensation energy is to be applied to the energy of the light emitted by the light source 12, the controller 80 will increase the energy of the light to be emitted by the light source 12 to X+Y mJ. The amount of compensation energy may be determined from data obtained for a particular type of the mask 18.

Figure 3:
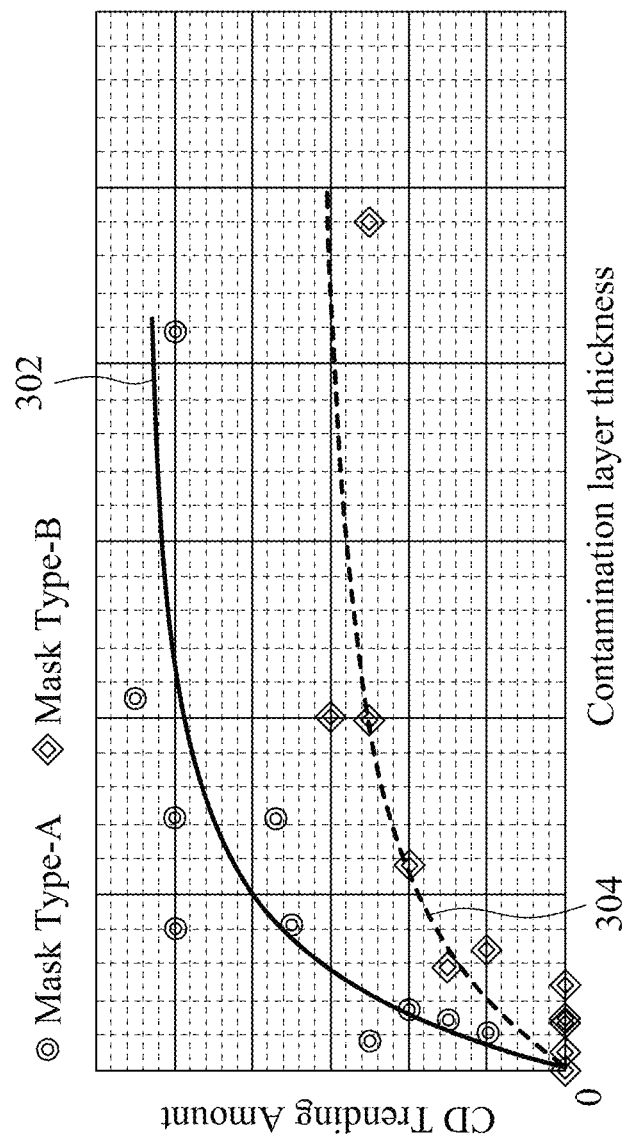
FIG. 3 is a chart showing a relationship between a thickness of a contamination layer and a decrease in critical dimension, in accordance with some embodiments.

FIG. 3 is a chart showing a relationship between a thickness of the contamination layer 56 and a decrease in CD in the pattern formed on the substrate 26, in accordance with some embodiments. As shown in FIG. 3, for a first type of the mask 18, such as mask type-A, 10 data points showing an increase in the thickness of the contamination layer 56 leads to a decrease (positive numbers on the y-axis) in CD in the pattern formed on the substrate 26 using the first type of the mask 18. The fitted line 302 shows a first relationship between the thickness of the contamination layer 56 and the decrease in CD. For a second type of the mask 18, such as mask type-B, 10 data points showing an increase in the thickness of the contamination layer 56 leads to a decrease in CD in the pattern formed on the substrate 26 using the second type of the mask 18. The fitted line 304 shows a second relationship between the thickness of the contamination layer 56 and the decrease in CD. As shown in FIG. 3, the first relationship is different from the second relationship. Thus, for different types of the mask 18, different relationships may be determined between the thickness of the contamination layer 56 and the decrease in CD. The relationship may be linear, quadratic, cubic, or other suitable relationship. In some embodiments, a relationship of a type of the mask 18 between the thickness of the contamination layer 56 and the decrease in CD is $y=K/(1+be^{-ax})$, where x is the thickness of the contamination layer 56, a, b, and K are constants from the fitted line (e.g., fitted line 302 or 304), and y is the decrease in CD.

After the relationship between the thickness of the contamination layer 56 and the decrease in CD is identified for each type of the mask 18, the relationship between the decrease in CD and the amount of compensation energy is identified. For example, the relationship may be for every 1 nm decrease in CD, 1 mJ in compensation energy may be applied. In some embodiments, the relationship between the decrease in CD and the amount of compensation energy is y=x, where y is the amount of compensation energy and x is the decrease in CD. As a result, a relationship of a type of the mask 18 between the thickness of the contamination layer 56 and the amount of compensation energy is $y=K/(1+be^{-ax})$, where x is the thickness of the contamination layer 56, a, b, and K are constants from the fitted line (e.g., fitted line 302 or 304), and y is the amount of compensation energy.

Referring back to FIG. 1, with the relationship between the thickness of the contamination layer 56 and the amount of compensation energy to be applied stored in the controller 80, the controller 80 can use the thickness information and the relationship to control the energy of the light emitted by the light source 12. For example, the controller 80 receives a signal from the thickness measuring device (i.e., the detector 32) and determines the thickness of the contamination layer 56. From the relationship stored in the controller 80, for example, $y=K/(1+be^{-ax})$, where x is the thickness of the contamination layer 56, a, b, and K are constants from the fitted line, the amount of compensation energy y can be calculated by the controller 80. The controller 80 then controls the light source 12 so that the energy of the light emitted is increased by an amount equals to the amount of compensation energy y. The light emitted by the light source 12 with the compensation energy applied removes the contamination layer 56 when the light reaches the mask 18. In some embodiments, the thickness of the contamination layer 56 is measured before a substrate 26 is processed. For example, before a substrate 26 is processed, the thickness measuring device is utilized to determine if a contamination layer 56 is formed on the mask 18, and if so, what is the thickness of the contamination layer 56. If the thickness of the contamination layer 56 is greater than a threshold value, compensation energy is applied to the light when processing the substrate 26. The thickness measuring device may be utilized before every substrate 26 is being processed. The thickness measuring device may perform in-situ inspection of the mask 18. In some embodiments, the thickness of the contamination layer 56 is measured before a group (or lot) of substrates 26 is processed.

Figure 4A:
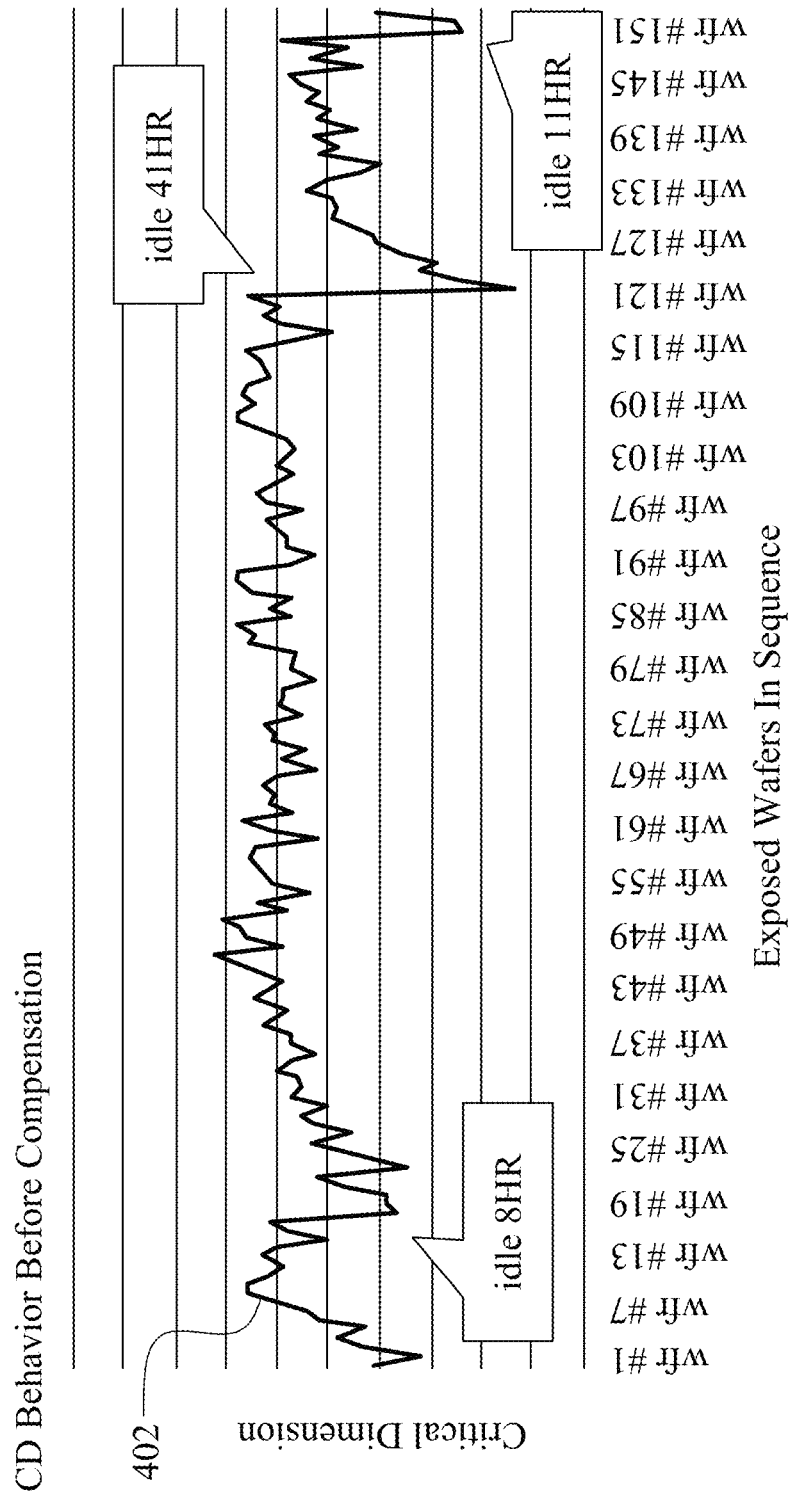
FIGS. 4A-4C are charts showing how compensate energy is applied to reduce variation in critical dimension for a group of substrates, in accordance with some embodiments.
Figure 4B:
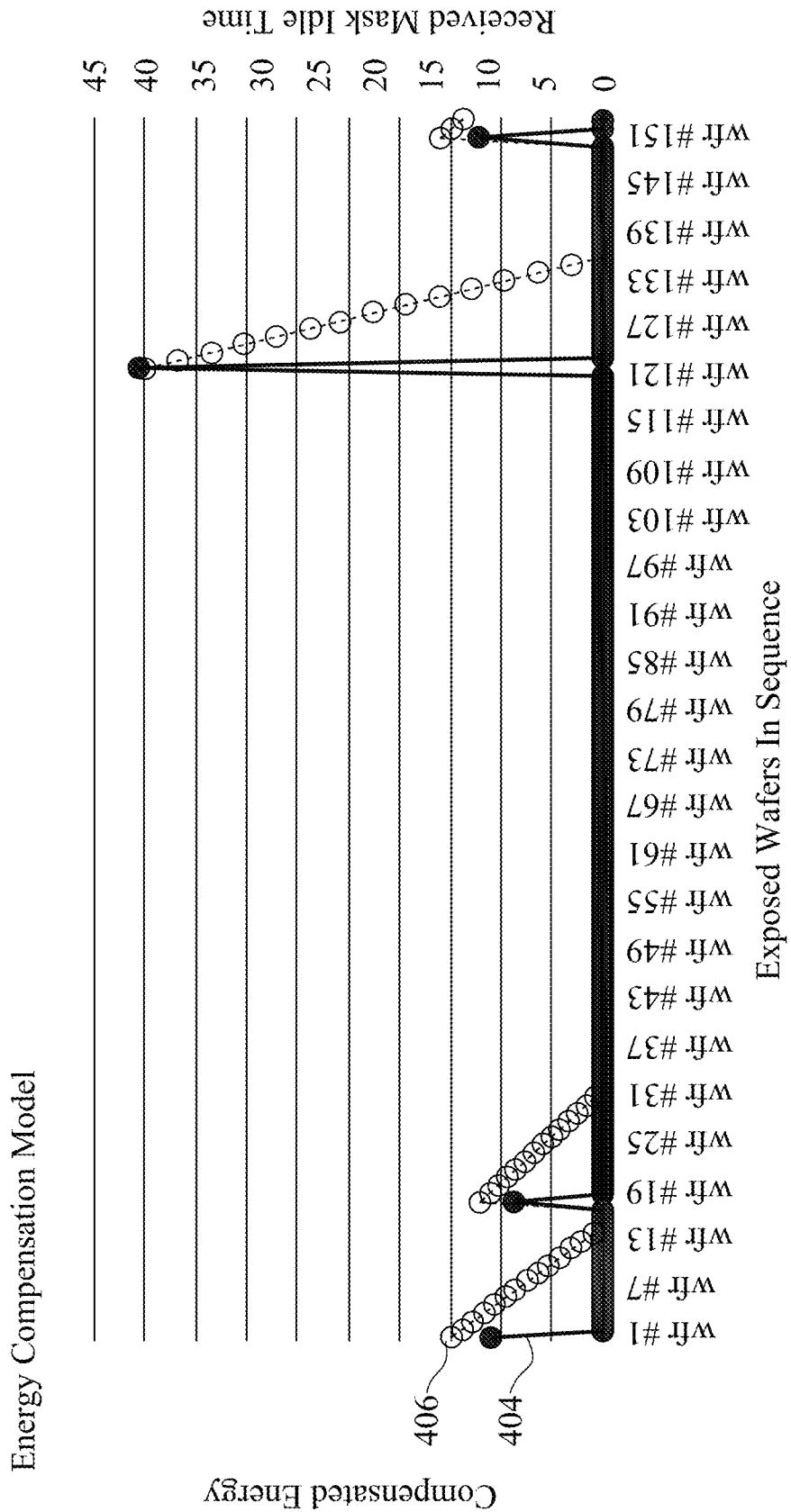
Figure 4C:
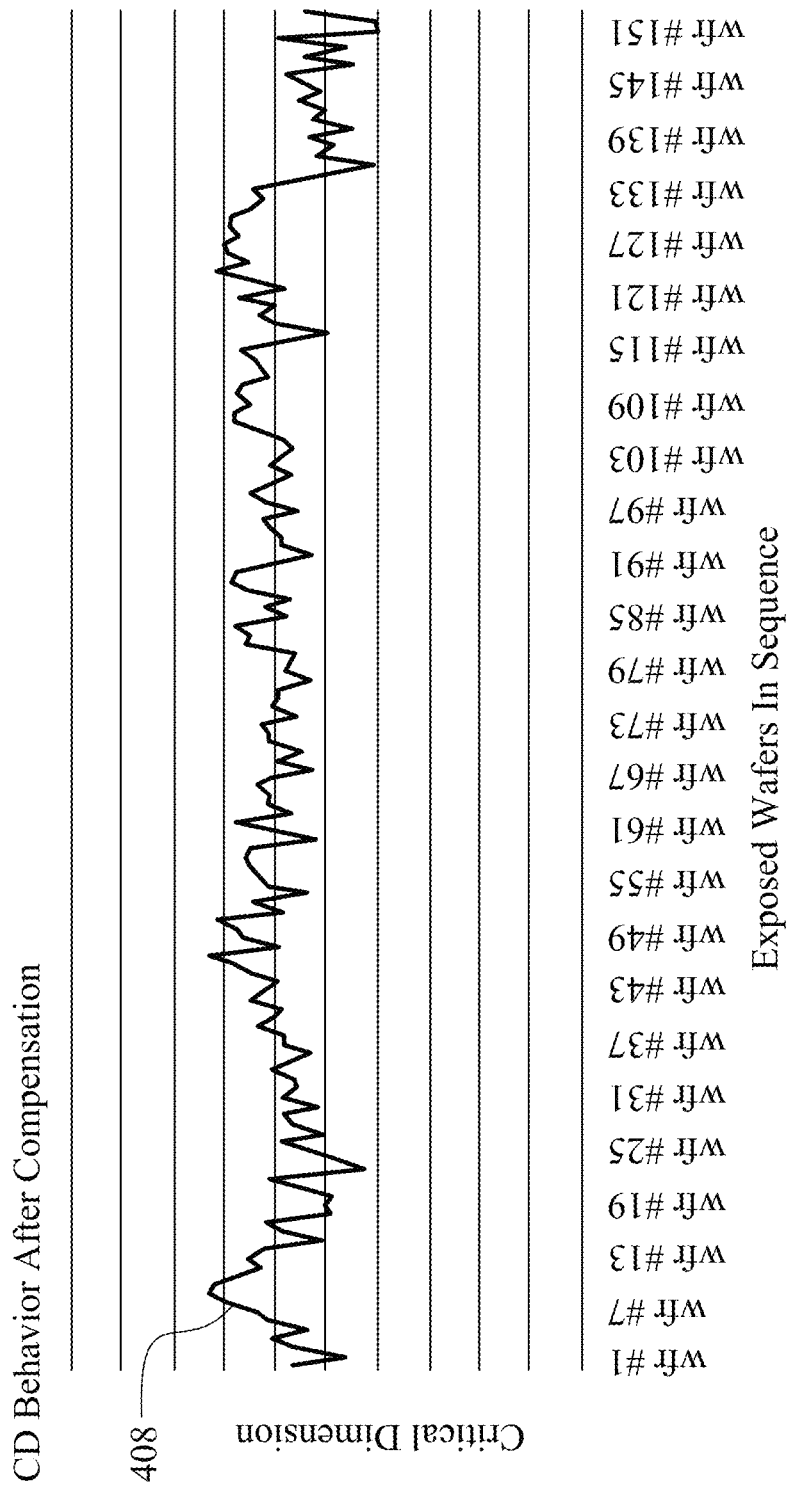

FIGS. 4A-4C are charts showing how compensate energy is applied to reduce variation in CD for a group of substrates, such as the substrates 26, in accordance with some embodiments. As shown in FIG. 4A, a group of substrates 26, or wafers, are processed using a single mask 18 without applying compensation energy. The group of substrates 26 may include any number of substrates 26 greater than 1. In some embodiments, the group of substrates 26 includes 151 substrates. The CDs of the substrates 26 are plotted as the line 402. The line 402 (i.e., the CDs of the patterns on the substrates 26) has high standard deviation (3σ is about 0.31). Specifically, the first wafer has a small CD due to the mask 18 being idle (such as being disposed in a mask storage prior to be placed in the lithography chamber), the $19^{th}$ wafer has a small CD due to the mask 18 being idle for about 8 hours, the $121^{st}$ wafer has a small CD due to the mask 18 being idle for about 41 hours, and the $151^{st}$ wafer has a small CD due to the mask 18 being idle for about 11 hours. As described above, the contamination layer 56 may be formed as a result of the mask 18 being idle. With the contamination layer 56, the CD of the pattern on the substrate 26 is decreased. Due to the 4 data points showing small CDs, the overall consistency of the CDs of the group of the substrates 26 is decreased (i.e., higher standard variation). The CD behavior represented by the line 402 for the particular type of the mask 18 may be stored in the controller 80 (FIG. 1).

FIG. 4B is a chart showing how compensation energy is applied. With the known relationship between the compensation energy and the thickness of the contamination layer 56 for the particular mask 18, for example, $y=K/(1+be^{-ax})$, where x is the thickness of the contamination layer 56, a, b, and K are constants from the fitted line (e.g., fitted line 302 or 304 shown in FIG. 3), and y is the amount of compensation energy, the compensation energy may be applied to the light emitted from the light source 12 when processing one or more substrates 26 of the group of the substrates 26. The right y-axis corresponds to the line 404, which is the amount of time the mask 18 is idle. The mask 18 may be located in the lithography system 10 or a mask storage 600 (FIG. 6) while being idle. The left y-axis corresponds to the line 406, which is the amount of compensation energy applied. For example, the mask 18 was idle for about 11 hours prior to processing the first substrate, and the thickness measuring device (i.e., the light source 30 and the detector 32) was used to measure a thickness of the contamination layer 56 formed on the mask 18 prior to processing the first substrate. With the thickness of the contamination layer 56 and the relationship between the thickness of the contamination layer 56 and the amount of compensation energy, the controller 80 (FIG. 1) controls the light source 12 (FIG. 1) to emit a light with the compensation energy applied. The compensation energy applied is represented by the line 406, which shows a gradual decreasing until reaching 0. The gradual decreasing is based on the CD behavior represented by the line 402 shown in FIG. 4A. The CDs of the substrates 26 gradually increases as the substrates 26 are processed, which means the contamination layer 56 is gradually removed by the light emitted by the light source 12 without the compensation energy. Thus, the compensation energy gradually decreases to help remove the contamination layer 56 without causing a surge in the CDs.

Based on the CD behavior stored in the controller 80, the controller 80 knows when to add compensation energy to the light emitted by the light source 12 (FIG. 1). For example, the line 402 (FIG. 4A) shows that before the 19$^{th}$ substrate 26, the mask 18 is idle for about 8 hours, and the CD of the 19$^{th}$ substrate 26 drops significantly. Thus, the controller 80 applies compensation energy to the light when processing the 19$^{th}$ substrate 26 in order to gradually remove the contamination layer 56 formed on the mask 18 during the 8 hours of the idle time. Similarly, the compensation energy gradually decreases until reaching 0 in order to help remove the contamination layer 56 without causing a surge in the CDs.

Similarly, before processing the 121$^{st}$ substrate 26, the mask 18 was idle for about 41 hours, and compensation energy was applied when processing the 121$^{st}$ substrate 26 in order to gradually remove the contamination layer 56 formed during the 41 hours of the idle time. Lastly, before processing the 151$^{st}$ substrate 26, the mask 18 was idle for about 11 hours, and compensation energy was applied when processing the 151$^{st}$ substrate 26 in order to gradually remove the contamination layer 56 formed during the 11 hours of the idle time.

FIG. 4C is a chart showing the result CD variation of the group of the substrates after compensation energy is applied based on the method described in FIG. 4B. As shown in FIG. 4C, the CDs of the substrates 26 are plotted as the line 408. The line 408 (i.e., the CDs of the patterns on the substrates 26) has low standard deviation (3σ is about 0.20) compared to the standard deviation of line 402 shown in FIG. 4A.

The embodiments shown in FIGS. 4A-4C illustrates a method for measuring the thickness of the contamination layer 56 formed on the mask 18 prior to processing a group of substrates 26. If the thickness of the contamination layer 56 is over a threshold value, compensation energy is applied when processing a first subgroup of substrates 26, and the compensation energy gradually decreases until reaching 0. Subsequently, with the CD variation data without compensation energy stored in the controller 80, the controller 80 determines when to apply compensation based on the stored CD variation data. In other words, the thickness measuring device is utilized once for every group of substrates 26.

Figure 5A:
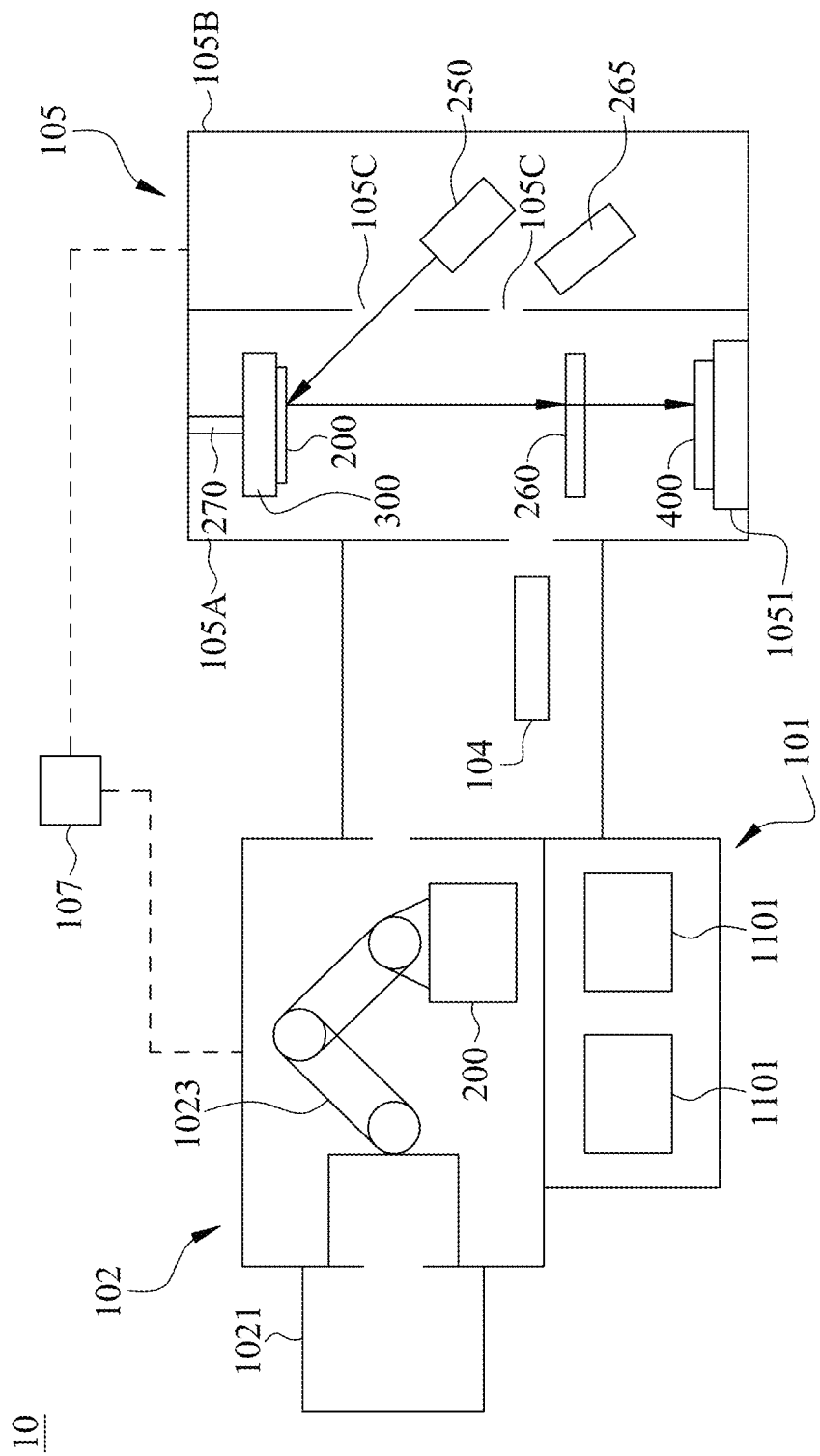
FIGS. 5A and 5B are schematic views of the lithography system, in accordance with alternative embodiments.
Figure 5B:
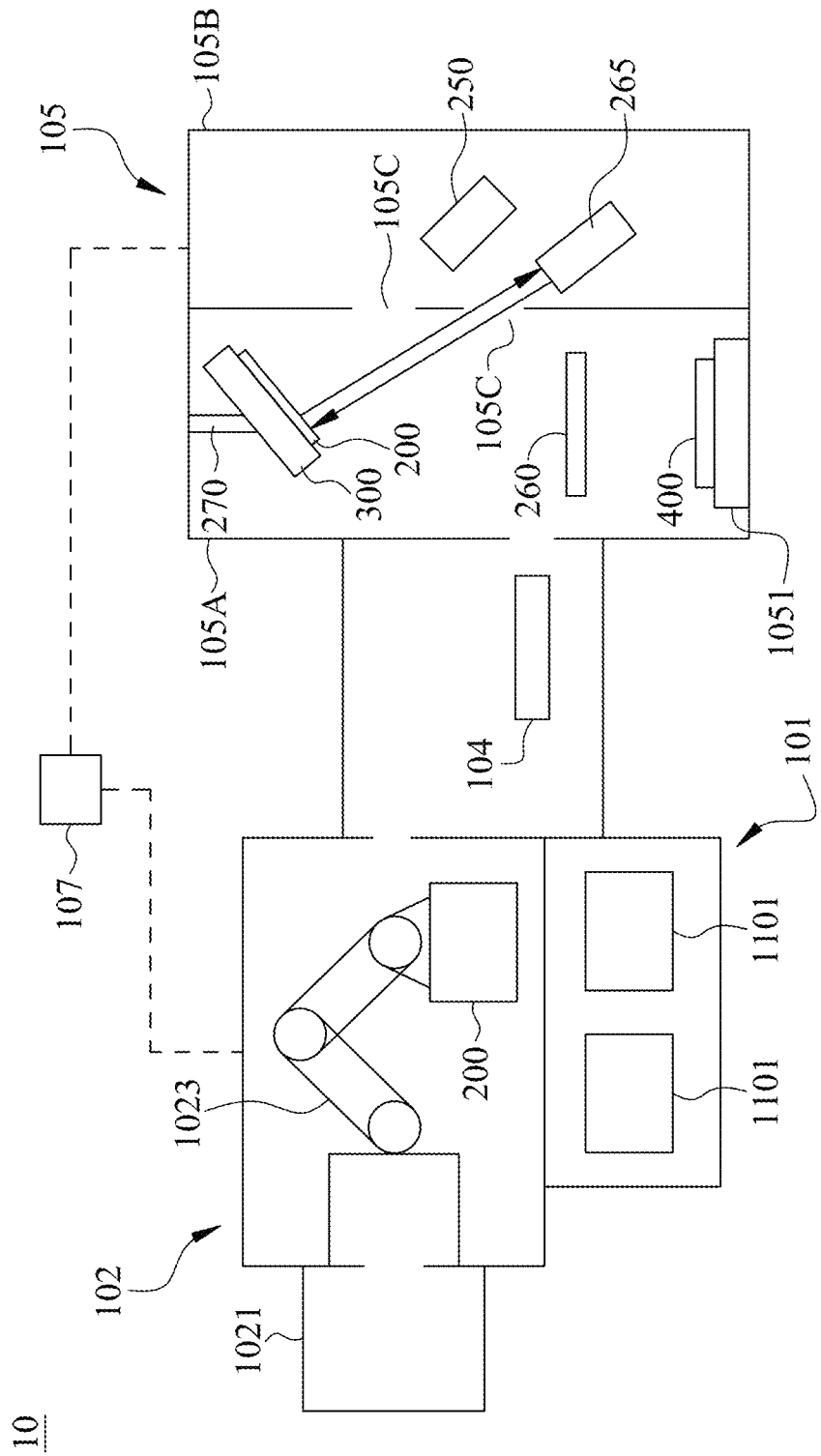

FIGS. 5A and 5B are schematic views of the lithography system 10, in accordance with alternative embodiments. As shown in FIG. 5A, in some embodiments, the lithography system 10 includes a load port 101, a transferring module 102, a transportation stage 104, a processing apparatus 105, and a controller 107. Elements of the lithography system 10 can be added to or omitted, and the disclosure should not be limited by the embodiments. In some embodiments, the lithography system 10 is an EUVL system and the processing apparatus 105 is an EUVL apparatus.

The transferring module 102 is configured to transfer a mask 200 between the load port 101 and the transportation stage 104. The mask 200 may be the mask 18 shown in FIG. 1. In some embodiments, the transferring module 102 is positioned between the load port 101 and the transportation stage 104. The transferring module 102 may include a control circuit 1021 and a robotic arm 1023. The control circuit 1021 is configured to generate an electrical signal to the robotic arm 1023, so as to control the robotic arm 1023 to transfer the mask 200. In some embodiments, the robotic arm 1023 may include a six-axis robot manipulator and is configured to hold the mask 200.

In some embodiments, the transportation stage 104 is used for conveying the mask 200 into the processing apparatus 105. As shown in FIG. 5A, the processing apparatus 105 can include a lithography chamber 105A and a device chamber 105B. One or more openings 105C may be formed in the chamber wall separating the lithography chamber 105A and the device chamber 105B. The lithography chamber 105A can include a mask stage 300, a substrate stage 1051 for supporting a substrate 400, and a projection optics module 260 (POB). The substrate 400 may be the substrate 26, the mask stage 300 may be the mask stage 16, the substrate stage 1051 may be the substrate stage 28, and the POB 260 may be the POB 20 described in FIG. 1.

As shown in FIG. 5A, in some embodiments, a light source 250 and a thickness measuring device 265 are disposed in the device chamber 105B. The light source 250 may be the light source 12 described in FIG. 1 and the thickness measuring device 265 may be the thickness measuring device (i.e., the light source 30 and the detector 32) described in FIG. 1. In some embodiments, the thickness measuring device 265 includes a light source, a detector, and other components, such as optical components. The thickness measuring device 265 is configured to perform in-situ measurement of the thickness of the contamination layer 56 formed on the mask 200. The thickness measuring device 265 may be utilized in the same manner as the thickness measuring device described in FIG. 1. The mask stage 300 is coupled to a shaft 270, and the shaft 270 is configured to tilt the mask stage 300 with respect to a plane substantially parallel to the top surface of the substrate stage 1051. The position of the mask stage 300 shown in FIG. 5A is set for a lithography process, where a light emitted from the light source 250 reaches the mask 200 and reflects to the substrate 400. FIG. 5B illustrates an embodiment where the mask stage 300 is tilted towards the thickness measuring device 265 for the thickness measuring device 265 to determine the thickness of the contamination layer 56 on the mask 200. The tilting of the mask stage 300 by the shaft 270 enables the light source and the detector of the thickness measuring device 265 to be located at the same position. The mask stage 300 may be tilted for the thickness measuring device 265 to inspect the mask 200 before processing each substrate 400 or before processing a group of substrates 400.

As shown in FIGS. 5A and 5B, the lithography system 10 may further include a controller 107 for control the operation of the lithography system 10. The controller 107 may be the controller 80 described in FIG. 1. In some embodiments, the controller 107 receives the thickness of the contamination layer 56 on the mask 200 from the thickness measuring device 265 and controls the light source 250 so compensation energy may be applied to the light emitted from the light source 250 in order to remove the contamination layer 56. As described above, the thickness measuring device 265 may be utilized to inspect the mask 200 before every substrate 400 being processed or before every group of substrates 400 being processed.

Figure 6:
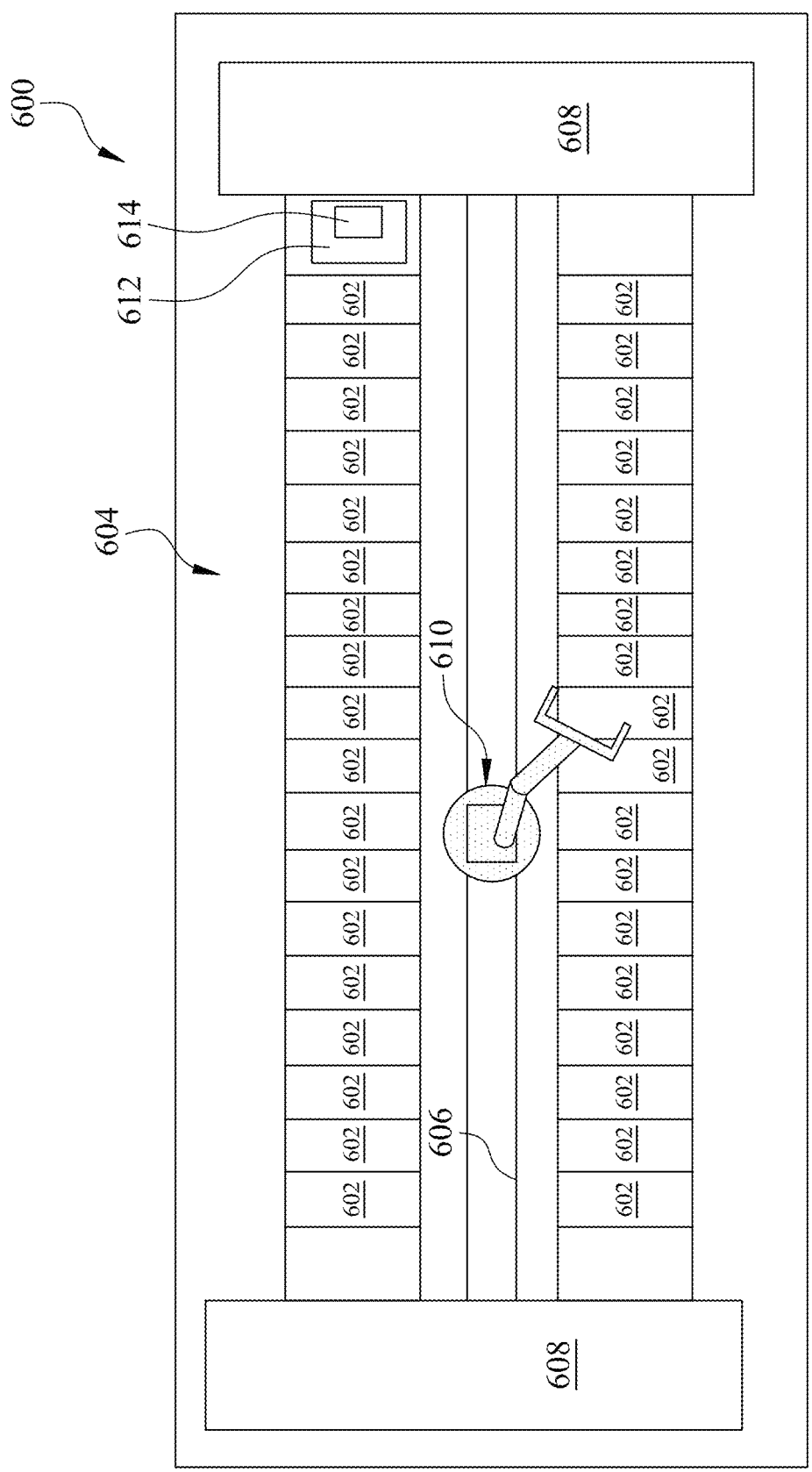
FIG. 6 is a schematic top view of a mask storage, in accordance with some embodiments.

FIG. 6 is a schematic top view of a mask storage 600, in accordance with some embodiments. The mask storage 600 may be part of the lithography system 10. As shown in FIG. 6, the mask storage 600 includes one or more arrays of storage units 602. Each storage unit 602 may be configured to store one or more masks 18 (or masks 200). A gantry 604 is disposed over the space between the arrays of storage units 602. The gantry 604 includes a rail 606 supported by supports 608. A robotic arm 610 is disposed on the rail 606 of the gantry 354. The robotic arm 610 is configured to transfer the mask 18 in and out of the mask storage 600. The mask storage 600 further includes a stage 612 and a thickness measuring device 614. Prior to be placed in the processing apparatus 105 (FIGS. 5A and 5B), the mask 18 (or the mask 200) may be placed on the stage 612 by the robotic arm 610, and the thickness measuring device 614 measures the thickness of the contamination layer 56 formed on the mask 18. The thickness measuring device 614 may be the thickness measuring device 265 described in FIGS. 5A and 5B. The thickness measuring device 614 may be electrically connected to a controller, such as the controller 80 or the controller 107, and the thickness information is sent to the controller. With the thickness of the contamination layer 56 determined, the controller can apply compensation energy to the light to remove the contamination layer 56 from the mask 18.

The thickness measuring device, such as the light source 30 and the detector 32 shown in FIG. 1, the thickness measuring device 265 shown in FIGS. 5A and 5B, or the thickness measuring device 614 shown in FIG. 6, are utilized to measure the thickness of the contamination layer 56 formed on the mask 18 (or the mask 200). The thickness of the contamination layer 56 may be measured before processing a substrate 26 (or a substrate 400) or measured before processing a group of substrates 26 (or substrates 400). Compensation energy may be applied to the light before and/or during the processing of one or more substrates 26 (or substrates 400) in order to remove the contamination layer 56 from the mask 18 (or the mask 200). The thickness of the contamination layer 56 may be measured in the processing apparatus as shown in FIGS. 1, 5A, and 5B, or in the mask storage 600 as shown in FIG. 6. The thickness may be measured in any location along the path of the mask 18 (or the mask 200) from the mask storage 600 to the processing apparatus. In some embodiments, a thickness measuring device may be located over the transportation stage 104 (FIGS. 5A and 5B). In some embodiments, multiple thickness measuring devices may be located along the path of the mask 18. For example, the thickness measuring device 614 and the thickness measuring device 265 may be both utilized.

The present disclosure in various embodiments provides a lithography system having a thickness measuring device for measuring a thickness of a contamination layer formed on a mask. The thickness measuring device may be located in the processing apparatus or in the mask storage. The thickness information is transformed to a signal of compensation energy, which may be applied to the light before each exposure (substrate to substrate) or before a group of exposures (lot to lot). Some embodiments may achieve advantages. For example, CD variation may be improved. Furthermore, no dummy substrate is used, which improves throughput.

An embodiment is a method. The method includes obtaining a relationship between thicknesses of a contamination layer formed on a mask and amounts of compensation energy to remove the contamination layer, obtaining a first thickness of a first contamination layer formed on the mask from a thickness measuring device, and applying first compensation energy calculated from the relationship to a light directed to the mask.

Another embodiment is a lithography process. The process includes performing the lithography process in a lithography system. The lithography system includes a first light source, a mask stage, a substrate stage, and a thickness measuring device configured to measure a thickness of a contamination layer formed on a mask to be disposed on the mask stage.

A further embodiment is a lithography system. The system includes a light source, a mask stage, a substrate stage, and a mask storage. The mask storage includes a plurality of storage units and a first thickness measuring device configured to measure a thickness of a contamination layer formed on a mask to be disposed in the mask storage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A method, comprising:
performing a first lithography process using a mask in a lithography system;
idling the mask for a period of time, wherein a contamination layer is formed on the mask;
measuring a thickness of the contamination layer formed on the mask; and performing a plurality of second lithography processes using the mask having the contamination layer, comprising:
  directing a first light from a first light source to the mask and a first substrate, wherein the first light has a first energy;
  directing the first light to the mask and a second substrate, wherein the first light has a second energy substantially less than the first energy;
  directing the first light to the mask and a third substrate, wherein the first light has a third energy substantially less than the second energy, and the contamination layer is removed;
  directing the first light to the mask and a fourth substrate, wherein the first light has a fourth energy substantially less than the third energy; and
  directing the first light to the mask and a fifth substrate, wherein the first light has the fourth energy.

2. The method of claim 1, wherein the thickness of the contamination layer is measured by directing a second light from a second light source to the mask.

3. The method of claim 1, wherein the measuring of the thickness of the contamination layer is performed in the lithography system.

4. The method of claim 1, wherein the measuring of the thickness of the contamination layer is performed in a mask storage.

5. The method of claim 1, wherein the period of time is greater than about eight hours.

6. The method of claim 5, wherein the mask is disposed in the lithography system while being idle.

7. The method of claim 1, wherein the first lithography process comprises:
  directing the first light to the mask and a sixth substrate, wherein the first light has the fourth energy.

8. A lithography process, comprising:
  directing a first light from a first light source to a mask, wherein the first light is configured to pattern a substrate;
  measuring a thickness of a first contamination layer formed on the mask; and
  adding a compensation energy multiple times to the first light to remove the first contamination layer, wherein each time an amount of the compensation energy is less than an amount of the compensation energy in the previous time.

9. The lithography process of claim 8, wherein the compensation energy is determined from a relationship between thicknesses of a second contamination layer and amounts of compensation energy to remove the second contamination layer.

10. The lithography process of claim 9, wherein the removing of the first contamination layer increases a critical dimension of a pattern formed in the substrate.

11. The lithography process of claim 10, wherein the thickness is measured by directing a second light from a second light source to the mask and reflecting the second light from the mask to a detector.

12. The lithography process of claim 10, further comprising reflecting the first light from the mask to a projection optics module.

13. The lithography process of claim 12, further comprising directing the first light to an illuminator prior to directing the first light to the mask.

14. The lithography process of claim 13, wherein the illuminator comprises mirrors that are switchable to reflect the first light to different illumination positions.

15. The lithography process of claim 10, wherein the first light is an extreme ultraviolet light.

16. The lithography process of claim 15, wherein the lithography process is an extreme ultraviolet lithography process.

17. A lithography system, comprising:
  a light source configured to expose a photoresist layer;
  a mask stage;
  a mask disposed on the mask stage;
  a substrate stage;
  a thickness measuring device configured to measure a thickness of a contamination layer formed on the mask; and
  a controller configured to collect data from the thickness measuring device and to control the light source to emit a light with gradually decreasing amounts of compensation energy to remove the contamination layer based on the data from the thickness measuring device.

18. The lithography system of claim 17, further comprising:
  an illuminator disposed between the light source and the mask stage; and
  a projection optics box disposed between the mask stage and the substrate stage.

19. The lithography system of claim 17, wherein the mask stage and the substrate stage are disposed in a lithography chamber, and the light source is disposed in a device chamber adjacent the lithography chamber.

20. The lithography system of claim 17, further comprising a mask storage, wherein the thickness measuring device is disposed in the mask storage.

* * * * *